United States Patent
Matsui et al.

(10) Patent No.: US 7,898,073 B2
(45) Date of Patent: Mar. 1, 2011

(54) SEMICONDUCTOR DEVICE AND SEMICONDUCTOR MODULE EMPLOYING THEREOF

(75) Inventors: Satoshi Matsui, Kanagawa (JP); Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/820,478

(22) Filed: Jun. 22, 2010

(65) Prior Publication Data
US 2010/0258918 A1 Oct. 14, 2010

Related U.S. Application Data

(62) Division of application No. 11/167,162, filed on Jun. 28, 2005, now Pat. No. 7,768,133.

(30) Foreign Application Priority Data

Jun. 30, 2004 (JP) .............................. 2004-194673

(51) Int. Cl.
*H01L 23/04* (2006.01)
(52) U.S. Cl. ................. 257/686; 257/678; 257/685; 257/690; 257/698; 257/734; 257/773; 257/774; 257/E23.011; 257/E23.145; 257/E23.151; 257/E23.174; 257/E23.175; 438/667
(58) Field of Classification Search ............... 257/678, 257/685, 686, 690, 698, 734, 773, 774, E23.011, 257/E23.145, E23.151, E23.174, E23.175; 438/667
See application file for complete search history.

(56) References Cited

U.S. PATENT DOCUMENTS

| 6,052,287 A | 4/2000 | Palmer et al. |
| 6,531,945 B1 | 3/2003 | Ahn et al. |
| 6,579,738 B2 | 6/2003 | Farrar et al. |

FOREIGN PATENT DOCUMENTS

| JP | 1998-223833 A | 8/1998 |
| JP | 2002-043502 A | 2/2002 |
| JP | 2002-170904 A | 6/2002 |
| JP | 2002-289623 A | 10/2002 |
| JP | 2003-151978 A | 5/2003 |
| JP | 2005-285972 A | 10/2005 |

*Primary Examiner*—Matthew E Warren
*Assistant Examiner*—John Lin
(74) *Attorney, Agent, or Firm*—Sughrue Mion, PLLC

(57) ABSTRACT

A semiconductor device is provided with a silicon substrate and a structure filled in a through hole that has a rectangular cross section and extends through the silicon substrate. The structure comprises a pipe-shaped through electrode, stripe-shaped through electrodes, silicons, a first insulating film, a second insulating film and a third insulating film. The pipe-shaped through electrode is utilized as a pipe-shaped electric conductor that extends through the silicon substrate. In addition, the stripe-shaped through electrodes are provided in the interior of the pipe-shaped through electrode so that the stripe-shaped through electrodes extend through the silicon substrate and is spaced away from the pipe-shaped through electrode. A plurality of through electrodes are provided in substantially parallel within the inner region of the pipe-shaped through electrode.

2 Claims, 9 Drawing Sheets

SEMICONDUCTOR DEVICE AND SEMICONDUCTOR MODULE EMPLOYING THEREOF

This application is a Divisional Application of U.S. patent application Ser. No. 11/167,162 filed Jun. 28, 2005, which claims priority to Japanese Patent Application No. 2004-194673 filed Jun. 30, 2004. The contents of all are incorporated herein by reference.

BACKGROUND OF THE INVENTION

1. Field of the Invention

The present invention relates to a semiconductor device comprising through electrodes and a semiconductor module employing thereof.

2. Related Art

In the conventional technique, bare chip stacked-type multi-chip module (MCM) has been proposed for the purpose of achieving higher degree of integration over a SiP of a package stacked-type or a type of having arranged chips in parallel. An interconnect extending through the semiconductor substrate is essential for the bare chip stacked-type module. Exemplary conventional bare chip stacked-type MCMs having a through electrode are described in Japanese Patent Laid-Open No. 1998-223,833 (H10-223,833), Japanese Patent Laid-Open No. 2002-170,904, Japanese Patent Laid-Open No. 2002-289,623 and Japanese Patent Laid-Open No. 2002-43,502.

Japanese Patent Laid-Open No. 1998-223, 833 and Japanese Patent Laid-Open No. 2002-170,904 describe semiconductor devices comprising columnar plugs that extend through the semiconductor chips. In the semiconductor devices described in Japanese Patent Laid-Open No. 1998-223,833 and Japanese Patent Laid-Open No. 2002-170,904, one interconnect is disposed corresponding to one opening of the semiconductor substrate having a plug embedded therein.

Japanese Patent Laid-Open No. 2002-289,623 discloses a structure, in which duplex insulating films are provided to enclose a conductive plug having a columnar shape and extending through a semiconductor region. Such configuration is provided by, firstly, providing a conductive via, and providing an insulator trench ring on the surface of the semiconductor substrate that is disposed outside of the conductive via, thereby forming the via structure comprising the duplex insulating films. It is described that forming of the duplex insulating films is helpful in inhibiting defect of insulation or defect of coupling between the bump bonding area and the semiconductor substrate.

Japanese Patent Laid-Open No. 2002-43,502 describes an exemplary via including duplex conductive films, which has a structure of leaving a column of silicon in the center thereof. It is described that the filling characteristics can be improved by employing the multiple structure for the ring-shaped slit via. Japanese Patent Laid-Open No. 2002-43,502 also discloses a chip for a semiconductor device having an electrically insulated ring-type Cu chipthrough plug. The ring-type chip through plug is formed by forming a ring-shaped concave portion so that a convex Si wafer is remained therein, providing a Cu film on an insulating film covering each of the side faces and a bottom face of the concave portion, and filling the concave portion by conducting an electrolytic plating technique from the Cu film as a starting point.

Japanese Patent Laid-Open No. 2002-43,502 also describes a configuration for forming duplex slit vias by a method, in which, when a ring-shaped slit via is filled up with Cu, the filling is not completed, and a slit of formed gap is filled with an insulating material. It is described that the time required for filling can be reduced by having the ring-shaped chip through plug, as compared with the case of filling the pipe-shaped concave portion. In addition, it is also described that an amount of the deposition required for filling the through hole with metal can be reduced to improve the throughput. It is also described that the bonding area between the chip through plug and the coupling electrode can be increased, so that the deterioration of the reliability can be inhibited.

SUMMARY OF THE INVENTION

However, it has now been discovered that, since one through plug corresponds to one interconnect in the techniques described in the above-described related art, it has been difficult to improve the density of the through electrodes. In addition, these techniques have left rooms for improvement, in view of the difficulty in reducing the parasitic capacitance and further the difficulty in providing additional functions to the through plug.

In addition, in the configurations described in Japanese Patent Laid-Open No. 1998-223,833, Japanese Patent Laid-Open No. 2002-170,904 and Japanese Patent Laid-Open No. 2002-289,623, filling time is significantly increased when a wide through electrode is employed in order to obtain the through electrode having lower resistance. Although the filling characteristics is improved by employing a simple linear slit via or a modified types thereof (that is, doughnut-shaped slit via) for the slit via described in Japanese Patent Laid-Open No. 2002-43,502, the contact area between the through electrode and the semiconductor substrate is increased as compared with the case of employing a solid columnar via. Thus, capacity thereof is increased. While the thickness of the insulating film should be thicker in order to reduce the capacity, the increased thickness causes an increase of the filling time. As such, the conventional techniques have left rooms for improvement, in view of increasing the filling characteristics.

In addition, the circumference of the through electrode is covered with the silicon substrate through the insulating film. Therefore, a parasitic capacitance is generated in the through electrode, depending upon the dielectric constant, the film thickness and the via diameter of the insulating film. When a ring-shaped structure having no slit via comprising the through electrode is employed, an increase of the thickness of the insulating film on the side wall of the via for the purpose of reducing the capacity of the through electrode leads to an increase of the time required for forming the insulating film. In addition, the area of the via opening is also increased. Thus, there is a concern that the insulating film can not fully be thicker, and thus it is difficult to sufficiently reduce the capacity.

In the technique described in Japanese Patent Laid-Open No. 2002-43,502, the slit via is employed mainly for the purpose of improving the filling characteristics, and the shape of the slit is changed from a rectangle to combined rectangular shapes or a ring-shaped, in order to increase the chip-coupling area. In such configuration, there is a concern that the parasitic capacitance of the through electrode comprising the through plug is increased. In addition, there is a concern that the resistance of the through electrode is increased.

Larger number of the stacked chip in the semiconductor module provides more interconnects that extend through one chip. Thus, an area of a region for forming the through electrode in the chip is increased, and therefore miniaturization of the chip is difficult to be achieved. The increase of the through electrode is significant, in particular for the stacked DRAM.

In the case of DRAM, since the necessary through electrode is increased by a number corresponding to the bus width for each layer of the interconnect layers, several thousand pins of the through electrodes may extend through one chip according to the circumstances. More specifically, in a case of 2,000 pins×3 layers, 6,000 pins are required for the first layer signal pins of the through electrodes. Among these pins, 4000 pins extend only the first layer. In this occasion, in the configuration, in which one interconnect is disposed corresponding to one through hole, the required area for forming the through electrode is enormous. In addition, there is a lower limit of the intervals between the through plugs, depending upon the specifications such as via diameter. Thus, in the configuration, in which one interconnect is disposed corresponding to one through hole, an area required for fixing the resistance per one through electrode is increased. Moreover, in the configuration, in which one interconnect is disposed corresponding to one through hole, vias employing thick insulating films for reducing the capacity are respectively used to conduct a supply of the electric power and a grounding (GND). Thus, although the load capacity can be relatively increased in the case of supplying electric power and providing grounding (GND), the configuration leads to the increase of the necessary number of vias and the area of the via.

Further, a cross talk noise caused by unwanted radiation from the through electrode is prone to be occurred in the through electrode region where signal pins are arranged with fine pitches in the conventional configurations. Finer pitches for the through electrodes provide more frequent generation of the noise.

As described above, the conventional techniques have left rooms for improvement, in view of the difficulty in providing much through electrodes at higher density while achieving the miniaturization of the device. Further, there have been rooms of improvement, in view of reducing the parasitic capacitance.

According to the present invention, there is provided a semiconductor device, comprising: a semiconductor substrate; a first pipe-shaped electric conductor extending through the semiconductor substrate; and a plurality of second electric conductors, extending through the semiconductor substrate and being provided in the interior of the first electric conductor spaced away from the first electric conductor.

The semiconductor device according to the present invention includes the configuration of providing the second electric conductor, which is provided in the interior of the first electric conductor spaced away from the first electric conductor. The semiconductor device also includes the configuration of providing a plurality of second electric conductors in the interior of the first electric conductor. Therefore, the electric conductors extending through the semiconductor substrate can be arranged within a very small area with high density.

The semiconductor device according to the present invention may include a configuration, in which plurality of the second electric conductors are provided to be mutually substantially parallel. Having such configuration, the second electric conductors can be arranged with higher density.

The semiconductor device according to the present invention may further comprises: a first insulating film covering an outer side face of the first electric conductor, a second insulating film covering an inner side face of the first electric conductor and a third insulating film covering a side face of the second electric conductors. Having such configuration, the insulation between the first electric conductor and the second electric conductors can be ensured.

The semiconductor device according to the present invention may include a configuration, in which the second insulating film and the third insulating film are separated by a semiconductor region. Having this configuration, the configuration of enabling the improvement in the filling characteristics in manufacturing of the first electric conductor and the second electric conductors. The semiconductor device according to the present invention may include a configuration, in which the semiconductor region may be a silicon region. The semiconductor device according to the present invention may include a configuration, in which the semiconductor region that separates the second insulating film and the third insulating film comprises a loop portion and a connecting portion that connects different two parts of the loop portion.

The semiconductor device according to the present invention may include a configuration, in which the first electric conductor and the second electric conductors are coupled so as to be in an equipotential. Having such configuration, the generation of the parasitic capacitance between the first electric conductor and the second electric conductor can be inhibited. The semiconductor device according to the present invention may include a configuration, in which plurality of the second electric conductors are coupled so as to be in an equipotential. Having such configuration, the generation of the parasitic capacitance between the second electric conductors can be inhibited.

According to the present invention, there is provided a semiconductor device, comprising: a semiconductor substrate; a first pipe-shaped electric conductor extending through the semiconductor substrate; and a second electric conductor, extending through the semiconductor substrate and coupling a region of the interior face of the first electric conductor to other region of the interior face of the first electric conductor.

The semiconductor device according to the present invention includes the configuration of providing the second electric conductor, which is disposed in the interior of the first electric conductor. Therefore, the electric conductors extending through the semiconductor substrate can be arranged within a limited region with high density. Further, since the first electric conductor is coupled to the second electric conductor, the first conductor and the second conductor are to be in equipotential. Thus, the configuration of preventing the generation of the parasitic capacitance between the first electric conductor and the second electric conductors can be provided. Further, the resistance of the electric conductor extending through the semiconductor substrate can be reduced.

The semiconductor device according to the present invention may include a configuration, in which plurality of the second electric conductors are provided to be mutually substantially parallel. Having such configuration, the second electric conductors can be arranged within a region inside of the first electric conductor at high density.

The semiconductor device according to the present invention may further comprise: a first insulating film covering an outer side face of the first electric conductor and a second insulating film covering an inner side face of the first electric conductor and a side face of the second electric conductors. Having such configuration, the insulation between the first electric conductor and the semiconductor region remaining in the side of the first electric conductor can be ensured. In addition, the insulation between the second electric conductor and the semiconductor region remaining in the side of the second electric conductor can also be ensured. Thus, the insulation between the first electric conductor and the second electric conductor can be ensured. The semiconductor device according to the present invention may include a configuration, in which the first insulating film is a loop film provided in a periphery portion of the semiconductor substrate.

According to the present invention, there is provided a semiconductor module, comprising a multilayered structure that includes the semiconductor device according to the present invention and other type of semiconductor device, wherein the first electric conductor or the second electric conductors is electrically coupled to the other type of semiconductor device. According to the semiconductor module of the present invention, a plurality of the semiconductor devices can be electrically coupled at high density by short distances.

According to the present invention, a technique for providing through electrodes within a small area at higher density can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

Figure 1:
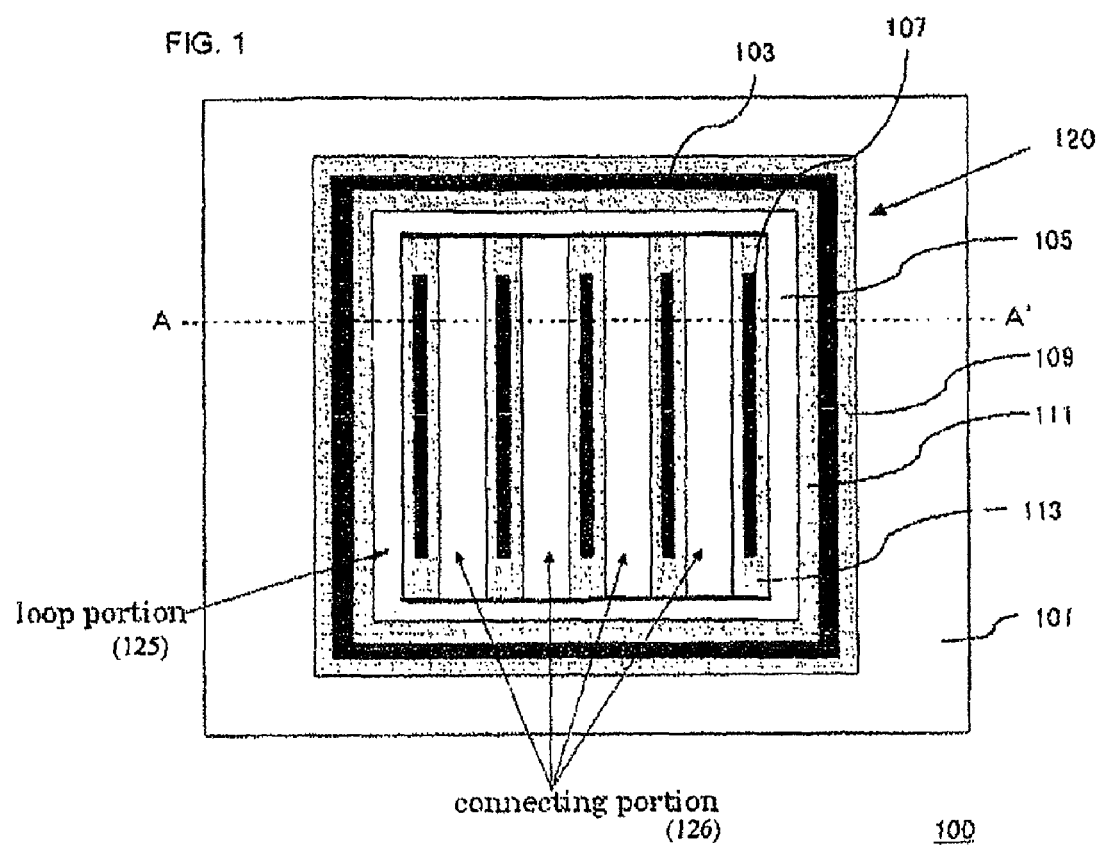
FIG. 1 is a plan view, schematically showing a configuration of a semiconductor device according to an embodiment of the present invention.

A semiconductor device 100 shown in FIG. 1 comprises a semiconductor substrate (silicon substrate 101), a pipe-shaped first electric conductor (pipe-shaped through electrode 103) extending through the semiconductor substrate and a plurality of second electric conductors (stripe-shaped through electrodes 107) extending through the semiconductor substrate and being provided in the interior of the first electric conductor spaced away from the first electric conductor.

Figure 3:
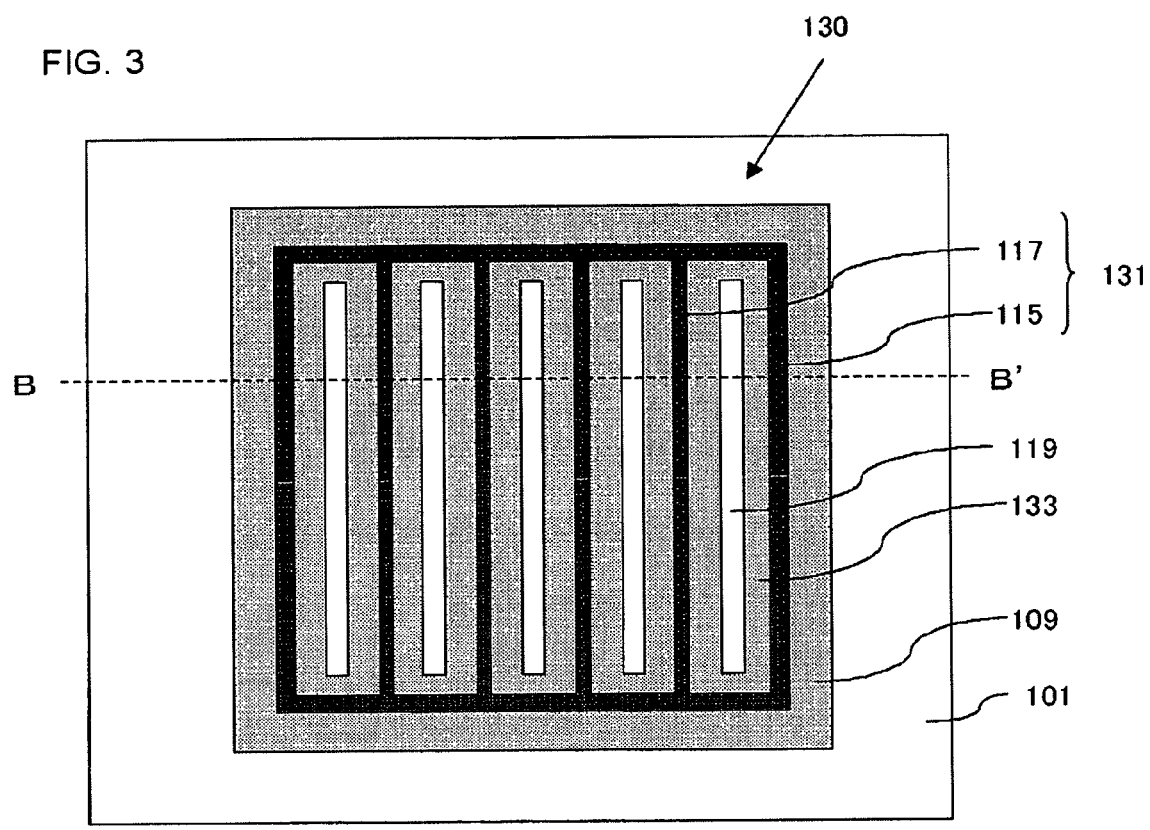
FIG. 3 is a plan view, schematically showing a configuration of a semiconductor device according to the embodiment of the present invention.

A Semiconductor device 110 shown in FIG. 3 comprises a semiconductor substrate (silicon substrate 101), a pipe-shaped first electric conductor (pipe-shaped through electrode 115), extending through the semiconductor substrate and second electric conductor (stripe-shaped through electrode 117) extending through the semiconductor substrate and coupling a region of the interior face of the first electric conductor to other region of the interior face of the first electric conductor.

Figure 9:
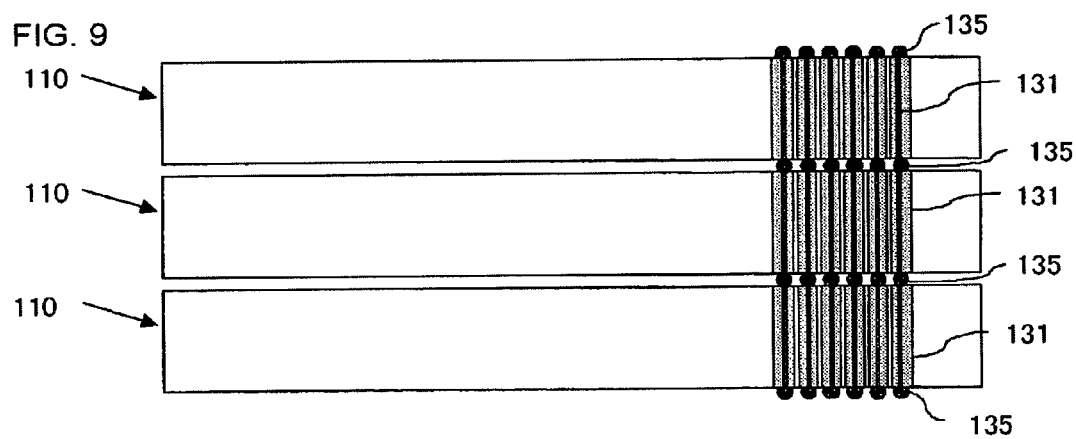
FIG. 9 is a cross-sectional view, schematically showing a configuration of a semiconductor device according to the embodiment of the present invention.

A multi-chip module shown in FIG. 9 has a multi-layered structure of the semiconductor devices 110 show in FIG. 3 and the other type of semiconductor devices 110. The first electric conductor (pipe-shaped through electrode 115) or the second electric conductor (stripe-shaped through electrode 117) is electrically coupled to the other type of semiconductor device 110.

First Embodiment

The present embodiment relates to a semiconductor device that comprises a through electrode. One or more stripe-shaped through electrode (s) are disposed in a mutually vicinity on the semiconductor substrate, and a pipe-shaped through electrode having a predetermined width encloses the outside of the stripe-shaped through electrodes.

Figure 2:
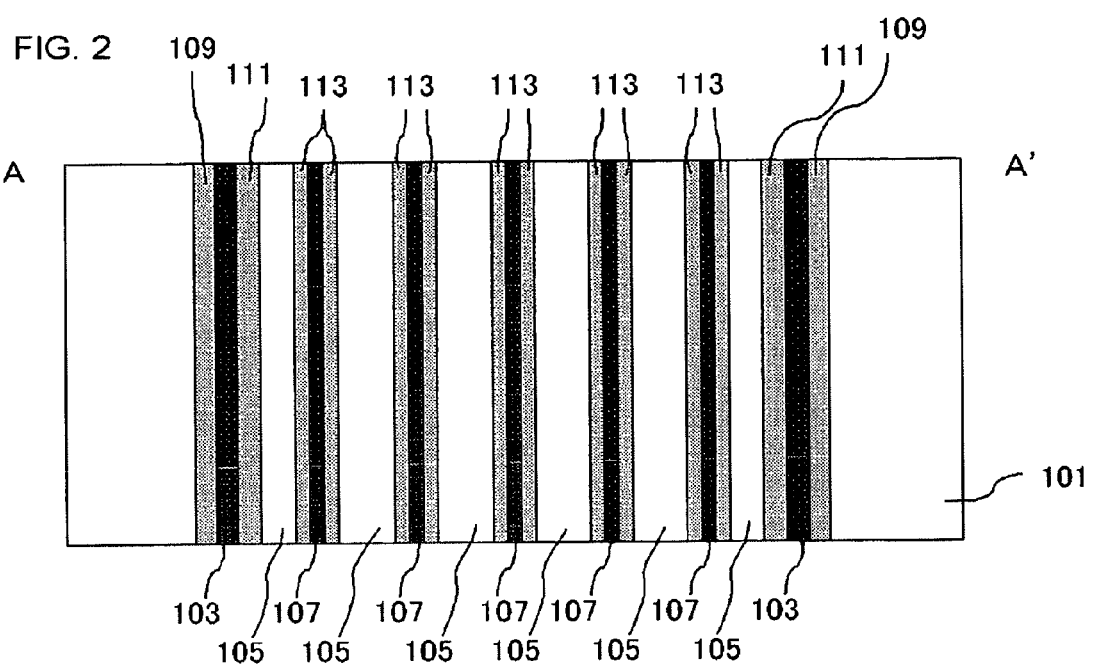
FIG. 2 is a cross-sectional view of the semiconductor device shown in FIG. 1 along a line A-A'.

FIG. 1 is a view, schematically showing a configuration of a semiconductor device according to the present embodiment. FIG. 2 is a cross-sectional view of FIG. 1 along A-A'. The semiconductor device 100 shown in FIG. 1 includes a silicon substrate 101 and a structure 120 filled within through holes having rectangular cross-sections that extends through (penetrates) the silicon substrate 101. The structure 120 comprises a pipe-shaped through electrode 103, stripe-shaped through electrodes 107, silicons 105, a first insulating film 109, a second insulating film 111 and third insulating films 113.

The pipe-shaped through electrode 103 is a pipe-shaped electric conductor extending through (penetrating) the silicon substrate 101. Two-dimensional shape of the pipe-shaped through electrode 103 is a loop having substantially rectangular shape. The stripe-shaped through electrodes 107 extend through (penetrate) the silicon substrate 101, and is provided in the interior of the pipe-shaped through electrode 103 spaced away from the pipe-shaped through electrode 103. In addition, a plurality of the stripe-shaped through electrodes 107 are provided in a relationship in substantially parallel (stripe-shaped). The cross-section in the substrate face of the stripe-shaped through electrodes 107 is substantially rectangle.

A region of the silicon 105, which is a semiconductor region, is remained between the stripe-shaped through electrode 107 and the pipe-shaped through electrode 103 in the through hole. The silicon 105 is provided to surround the circumference of the stripe-shaped through electrodes 107.

The second insulating film 111 and the third insulating film 113 are separated by the silicon 105. Having such configuration, the filling characteristics in the process for manufacturing the pipe-shaped through electrode 103 and the stripe-shaped through electrodes 107 can be improved. In addition, as shown in FIG. 1, the silicon 105 comprises a loop portion 125 and a connecting portion 126 that connects different two parts of the loop portion.

The first insulating film 109 provides an electrical insulation between the inner face of the through hole and the pipe-shaped through electrode 103. Also, the second insulating film 111 provides an electrical insulation between the pipe-shaped through electrode 103 and the silicon 105. Also, the third insulating film 113 provides an electrical insulation between the silicon 105 and the stripe-shaped through electrodes 107. More specifically, the structure comprises the first insulating film 109 that covers the outer side face of the pipe-shaped through electrode 103, the second insulating film 111 that covers the inner side face of the pipe-shaped through electrode 103 and the third insulating film 113 that covers the side face of the stripe-shaped through electrodes 107. Having such structure, the insulation between the pipe-shaped through electrode 103 and the stripe-shaped through electrodes 107 can be ensured.

The pipe-shaped through electrode 103 and the stripe-shaped through electrodes 107 are composed of an electric conductor, and more specifically, metals such as Cu, Au, W, Al, Ni and the like, a metal silicide or polysilicon, for example, may be employed. A conductive member such as a bump or an interconnect may be coupled to the upper face or the lower face of the pipe-shaped through electrode 103 or the silicon 105 as described later, though it is not shown in FIG. 1 or FIG. 2.

The first insulating film 109, the second insulating film 111 and the third insulating film 113 function as barrier films for covering the side walls of the pipe-shaped through electrode 103 or the stripe-shaped through electrodes 107, and inhibit the diffusion of metal compositions contained in the pipe-shaped through electrode 103 and the stripe-shaped through electrodes 107 to the silicon substrate 101 or the silicon 105. Materials for the barrier film may be, for example, a nitride film such as SiN, SiON and the like, an oxide film such as $SiO_2$ and the like. Further, a multi-layered film obtained by stacking two or more layers of the films may also be employed. Functions as the barrier film can further be ensured by employing SiN, SiON or the like as the materials for the first insulating film 109 and the second insulating film 111. Further, the thicknesses of the first insulating film 109 and the second insulating film 111 may be, for example, equal to or higher than 10 nm. Having such configuration, functions as the barrier film can further be ensured.

While the configuration of providing one through hole and one structure 120 on the silicon substrate 101 is illustrated in FIG. 1, number and arrangement of the structure (s) 120 are not particularly limited, and may be suitably selected depending on the design of the semiconductor device 100. While the configuration, in which the pipe-shaped through electrode 103 and the stripe-shaped through electrodes 107 have the corner sections from the upper viewpoint, is illustrated in FIG. 1, the corner sections of the pipe-shaped through electrode 103 and the stripe-shaped through electrodes 107 may be removed. In addition, while the cross section of through electrode shown in FIG. 2 is rectangle, the cross section of through electrode may be shape that is not rectangle (for example, taper, reverse-taper and the like).

Next, the process for manufacturing the semiconductor device 100 shown in FIG. 1 will be described. Concerning the semiconductor device 100, a via (recess portion), which is not extended through (penetrated) the semiconductor substrate, is formed, and the insulating film and the conductive film are sequentially provided, and then the interior of the via is filled with the conductive film. Thereafter, the semiconductor substrate is partially removed from the back surface thereof to expose the surface of the conductive film, thereby obtaining the semiconductor device 100.

FIG. 7A to FIG. 7C and FIG. 8A and FIG. 8B are cross-sectional process views of the semiconductor device, schematically showing a process for manufacturing the semiconductor device according to the embodiment. Firstly, the surface of the silicon substrate 101 is patterned by employing a photolithography technique, so as to provide an opening at a position for providing the structure 120. The shape of the pattern may be a suitable pattern formed by partially remaining the silicon 105 so as to provide openings at respective positions for providing the first insulating film 109, the pipe-shaped through electrode 103, the second insulating film 111, the stripe-shaped through electrodes 107 and the third insulating film 113.

Figure 7A:
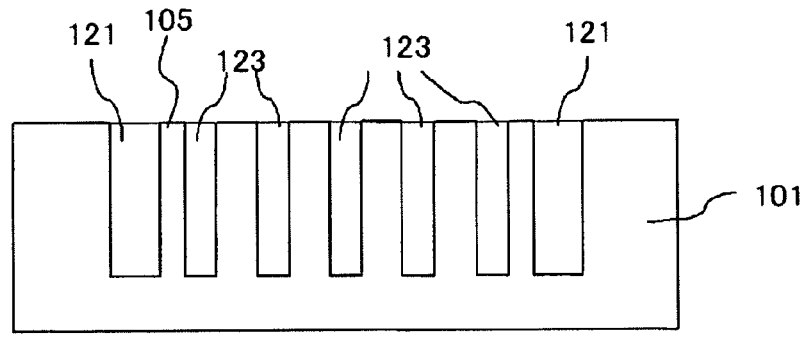
FIGS. 7A to 7C are cross-sectional process views of the semiconductor device, schematically showing a process for manufacturing the semiconductor device according to the embodiment.

Then, the silicon substrate 101 is etched to form slit-shaped openings 121 and a plurality of slit-shaped parallel openings 123 (FIG. 7A). The two-dimensional shape of the opening 121 is a substantially rectangular loop. Further, the two-dimensional shape of the opening 123 is substantially rectangular. In addition, the opening 121 or the opening 123 may be tapered so as to decrease the opening width from the surface of the silicon substrate 101 toward the bottom thereof. Having such configuration, the filling of a conductive film 127 described later can be much further ensured.

Figure 7B:
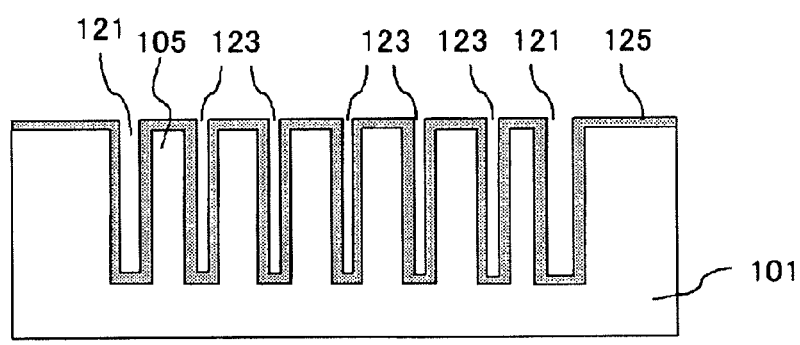

Thereafter, an insulating film 125 is deposited on the entire face of the opening forming face of the silicon substrate 101 containing the side face and the bottom face of the opening 121 and the opening 123 (FIG. 7B). The insulating film 125 is a film, which will be the first insulating film 109, the second insulating film 111 and the third insulating film 113 by a manufacturing process described later. When the insulating films are SiN films, for example, an SiN film having a thickness of on the order of 50 nm may be formed to provide the insulating film 125 by a plasma chemical vapor deposition (plasma CVD).

Figure 7C:
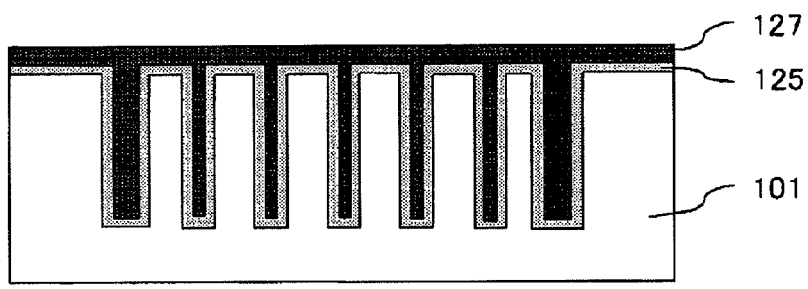

Subsequently, a metal seed film such as seed Cu film (not shown in the drawings) is deposited on the entire face of the upper face of the insulating film 125. Thereafter, the conductive film 127, which will be the pipe-shaped through electrode 103 and the stripe-shaped through electrodes 107, is deposited by an electrolytic plating technique, for example. The conductive film 127 may be, for example, a metal film such as Cu film (FIG. 7C). Further, in the process for forming the conductive film 127, filling with a tungsten (W) film or a polysilicon may also be performed by a CVD technique.

Figure 8A:
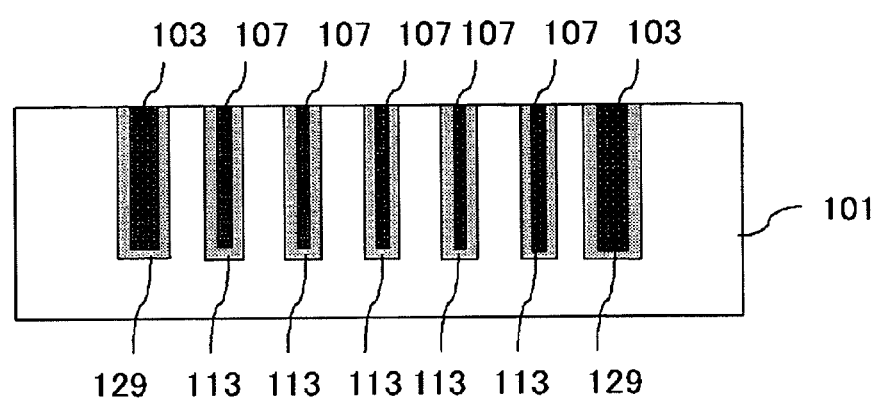
FIGS. 8A and 8B are cross-sectional process views of the semiconductor device, schematically showing a process for manufacturing the semiconductor device according to the embodiment.

Next, the conductive film 127 on the silicon substrate 101 is removed by a chemical mechanical polishing (CMP). Having such process, the conductive film 127 is divided into the pipe-shaped through electrode 103 and the stripe-shaped through electrodes 107. Further, in the present embodiment, the insulating film 125 is removed by an etching after performing CMP process. Having such process, the insulating film 125 is divided into the insulating film 129, which will be the first insulating film 109 and the second insulating film 111, and the third insulating film 113 (FIG. 8A).

An insulating film may be deposited on the entire of the polishing surface after the CMP process to form an interconnect layer having a predetermined interconnect by using, for example, a damascene process, although it is not shown in FIG. 1 and FIG. 2. The interconnect layer may be mono-layered, or multi-layered.

Figure 8B:
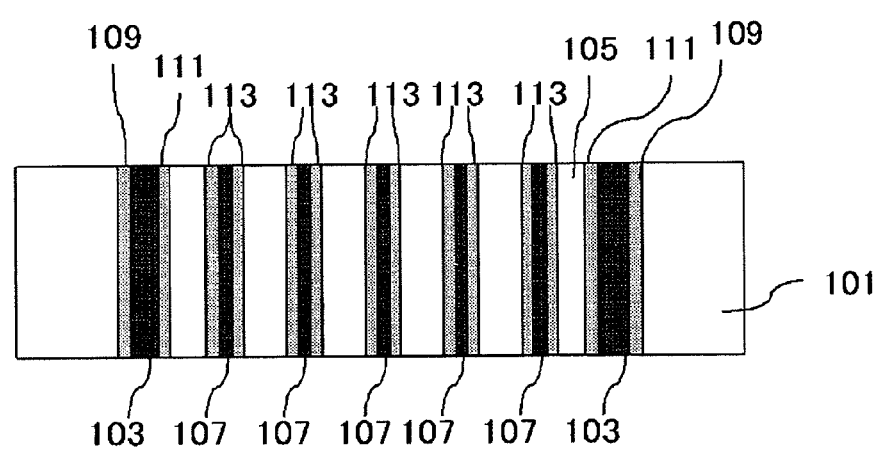

Next, the polishing face side thereof is fixed to a support member (not shown in the drawings) to perform a process for reducing the thickness of the silicon substrate 101. The process for reducing the thickness may utilize a grinding process, a polishing process, an etch process or the like. For example, a back surface grinding may be performed by a mechanical polishing technique. The thickness of the thinned silicon substrate 101 is appropriately selected depending on the device configuration of the semiconductor device 100, and the thickness of on the order of 20 to 400 μm may be employed, when the semiconductor device 100 is a silicon interposer, for example. The insulating film 129 is divided into the first insulating film 109 and the second insulating film 111 by performing the process for reducing the thickness (FIG. 8B). Thereafter, the support member (not shown in the drawings) is removed off from the silicon substrate 101 to obtain the semiconductor device 100 shown in FIG. 1 and FIG. 2.

Next, the advantageous effect obtainable by employing the semiconductor device shown in FIG. 1 will be described as follows.

The semiconductor device 100 in FIG. 1 comprises the structure 120 having the stripe-shaped through electrodes 107 and the pipe-shaped through electrode 103, which are mutually insulated. Thus, advantageous effects of an increase of the density for arranging the through electrodes, a reduction of the filling time, a reduction of the interconnect capacity, an improvement in the reliability, a reduction of the cross talk noise and a reduction of electro magnetic interference (EMI) can be obtained.

In the semiconductor device 100, the structure 120 has the configuration, in which plurality of stripe-shaped through electrodes 107 are disposed in the interior of the pipe-shaped through electrode 103. This configuration corresponds to a configuration, in which the long stripe-shaped through electrode is divided to provide a plurality of stripe-shaped through electrodes and the circumference thereof is surrounded by the pipe-shaped through electrode 103. Thus, a ratio of an area of a region for forming the stripe-shaped through electrodes 107 (that is, an area of region enclosed by the pipe-shaped through electrode 103) to a length of the pipe-shaped through electrode 103 and the stripe-shaped through electrodes 107 in the two-dimensional configuration can be reduced, as compared with the conventional configuration having the long stripe-shaped through electrode disposed on the substrate. Thus, a "through hole neck", which corresponds to a "pad neck" in a stacked-type multi-chip module, for example, can be resolved.

Further, since the high-density arrangement of the through electrodes within a reduced region can be achieved, bus width between chips can be enlarged.

By employing the semiconductor device 100, it is possible to achieve a chip on chip coupling of a large capacity memory and a system LSI, for example. Further, an increase of pins of the bump coupling and a reduction of the intervals therebetween can be achieved. For example, the semiconductor device 100 shown in FIG. 1 can be preferably utilized as a silicon interposer that is provided between a semiconductor chip having a logic circuit and a memory chip having a memory element such as DRAM, and connected between the semiconductor chip and the memory chip.

For example, the interposer is provided between a logic LSI and a DRAM in the multi-layered semiconductor device. Since the electrical conduction between the logic LSI and the DRAM can be performed by utilizing the through electrode of the interposer in such multi-layered semiconductor device, advantageous effects such as an improvement in the processing speed and a reduction of the power consumption and the like can be obtained, as compared with the case of providing the electrical conduction between the logic LSI and the DRAM by a wire bonding.

Further, the semiconductor device 100 may alternatively be a memory chip including a memory element such as DRAM and the like. Concerning the memory chip having much number of the external terminals, an electrical coupling through the external terminals can be ensured by having a configuration comprising the structure 120. In addition, the semiconductor device 100 may alternatively be a logic chip including a logic chip element layer by being formed transistors or the like therein.

Further, in the semiconductor device 100, for example, all the through electrodes, or in other words the pipe-shaped through electrode 103 and the stripe-shaped through electrodes 107 can be coupled to one interconnect. In other words, the pipe-shaped through electrode 103 is coupled to the stripe-shaped through electrodes 107 so as to be in equipotential. Having such configuration, the generation of the parasitic capacitance between the pipe-shaped through electrode 103 and the stripe-shaped through electrodes 107 can be inhibited.

Further, a plurality of stripe-shaped through electrodes 107 are provided within one structure 120. Thus, a plurality of stripe-shaped through electrodes 107 can be coupled to a common signal line, and the coupling is provided so that a plurality of stripe-shaped through electrodes 107 are in an equipotential. Having such configuration, a configuration that is substantially equivalent to a wider interconnect can be presented while reducing the filling time. More specifically, the present embodiment provides the structure for reducing load and enabling the filling in a short period of time, as compared with the conventional configuration that provides thicker through plug. In addition, the coupling reliability is also improved by coupling a plurality of stripe-shaped through electrodes 107 to a common signal line.

In addition, in the structure 120, a coupling of a plurality of stripe-shaped through electrodes 107 to an interconnect can be achieved by providing an interconnect layer on the chip. Thus, the interconnect having lower resistance and lower capacity can be obtained without increasing the filling width. In addition, the coupling reliability can be increased by an exponential-times as compared with the case coupling one stripe-shaped through electrodes 107 to one interconnect, by having a configuration for coupling a plurality of stripe-shaped through electrodes 107 to one interconnect.

In addition, the structure 120 has the configuration that can be manufactured with a simple manufacturing process. In addition, different through electrodes having different structures such as a combination of the pipe-shaped through electrode 103 and an ordinary solid through plug can be simultaneously formed in one via with a simple manufacturing process. Further, a plurality of through electrodes having different electrical characteristics can be simultaneously obtained in a serial manufacturing process. Here, plurality of electrical characteristics may be, for example, resistance and capacity.

The semiconductor device 100 shown in FIG. 1 has a configuration, in which the pipe-shaped through electrode 103 are disposed so as to surround a plurality of stripe-shaped through electrodes 107. Thus, all the through electrodes can be in equipotential and the capacity in the through electrodes can be zero. As such, according to the present embodiment, the structure 120 having a reduced capacity can be stably formed with a simple manufacturing process.

In the semiconductor device 100, a signal interconnect can be connected to the stripe-shaped through electrodes 107.

Since this provides a configuration, in which only the central stripe-shaped through electrode 107 insulated doubly is coupled to the signal interconnect, the coupling reliability can be improved. Further, the cross talk noise and/or the EMI can be reduced.

Further, the semiconductor device 100 may have a configuration, in which the stripe-shaped through electrodes 107 are surrounded by the pipe-shaped through electrode 103, and the stripe-shaped through electrodes 107 are coupled to the signal line. Having this configuration, all signal pins can be shielded by a power source or GND. Since this provides surrounding the noise source with the electric conductor, radiation from the through electrodes can be reduced. Thus, electromagnetic wave emitted from the central signal interconnect can be reduced. Therefore, reduction of the cross talk noise and the EMI can be achieved. Further, the configuration of being easy to eliminating an IR drop may be provided.

Further, in the semiconductor device 100, the pipe-shaped through electrode 103 may be used as a through electrode for shielding for the stripe-shaped through electrodes 107. The pipe-shaped through electrode 103, which is an outer through electrode, may be coupled to a power source or GND to provide a shield. Having such configuration, when a multi-chip module is employed for the semiconductor device 100, cross talk noise and electro magnetic interference (EMI) in the interior of the multi-chip module can be reduced.

In the semiconductor device 100, the structure 120 comprises the pipe-shaped through electrode 103 and the stripe-shaped through electrodes 107 as through electrodes. Thus, the signal interconnect and the power source or the GND interconnect can be provided together in the structure 120. Thus, the power source or GND disposed in one via area can be supplied through one common through hole that is also utilized for the signal line. Therefore, electric power can be supplied with a reduced interconnection length. Thus, an inhibition of an IR drop can be achieved.

Here, the two-dimensional shape of the pipe-shaped through electrode 103 is not limited to rectangular shape provided that it is pipe-shaped in the present embodiment. For example, the two-dimensional shape of the pipe-shaped through electrode 103 may be a circular loop, an elliptic loop, polygonal loop or the like. Further, while through electrodes 107 shown in FIG. 2 have stripe shape, shape of through electrodes 107 may be selected from group comprising circle, rectangle, ellipse, and polygon. In addition, a plurality of through electrodes 107 may be arranged like the array.

In a following embodiment, different points from first embodiment will be mainly described.

Second Embodiment

Figure 4:
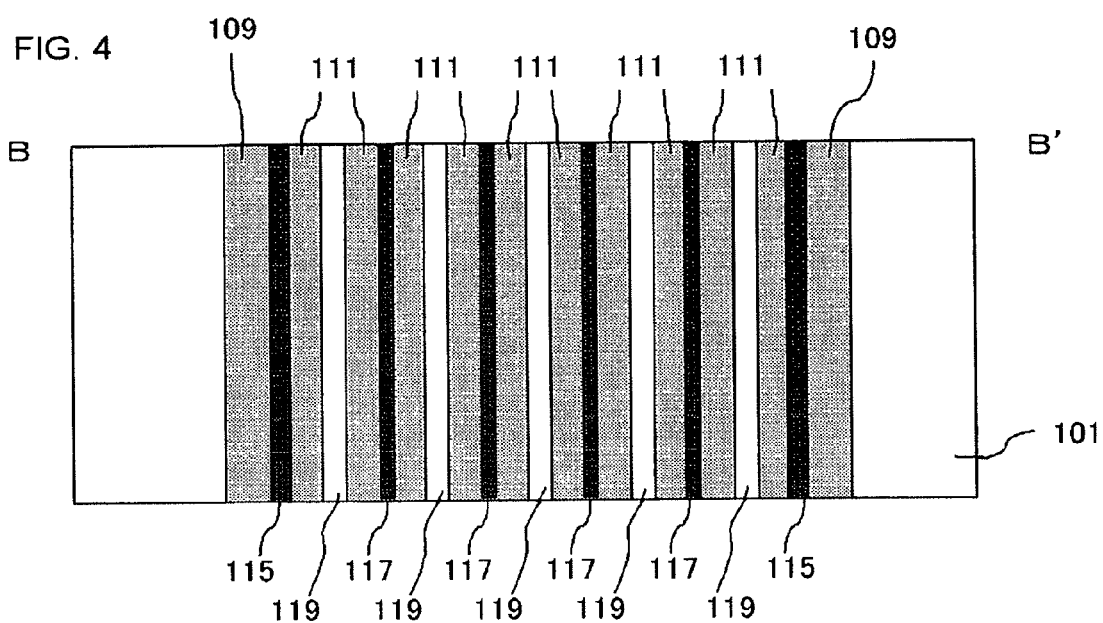
FIG. 4 is a cross-sectional view of the semiconductor device shown in FIG. 3 along a line B-B'.

FIG. 3 is a cross-sectional view, schematically showing a configuration of a semiconductor device according to the present embodiment. FIG. 4 is a B-B' cross-sectional view of FIG. 3. As shown in FIG. 3 and FIG. 4, a semiconductor device 110 comprises a silicon substrate 101 and a structure 130 extending through (penetrating) the silicon substrate 101. The structure 130 comprises through electrodes 131, silicons 119, a first insulating film 109 and a second insulating film 133.

The through electrode 131 is a continuous and integrated member of a pipe-shaped through electrode 115 and a stripe-shaped through electrodes 117. The pipe-shaped through electrode 115 is a pipe-shaped electric conductor extending through (penetrating) the silicon substrate 101. Two-dimensional shape of the pipe-shaped through electrode 115 is a rectangular loop.

Further, the stripe-shaped through electrodes 117 extend through (penetrate) the silicon substrate 101 to couple a region of the pipe-shaped through electrode 115 to other region thereof, and to separate the inner region of the pipe-shaped through electrode 115 into a plurality of regions. A cross section shape in the substrate face of the stripe-shaped through electrodes 117 is rectangular. As shown in FIG. 3, the stripe-shaped through electrodes 117 couples opposite sides of the pipe-shaped through electrode 115 that are opposing in two-dimensional arrangement. Also as shown in FIG. 3, a plurality of stripe-shaped through electrodes 117 are provided to be mutually in substantially parallel.

A plurality of silicons 119 are remained between the pipe-shaped through electrode 115 and the stripe-shaped through electrodes 117 in the through hole. A plurality of silicons 119 are arranged to be mutually in parallel.

The first insulating film 109 provides an electrical insulation between the inner side face of the through hole and the pipe-shaped through electrode 115. Also, the second insulating film 113 provides an electrical insulation between the through electrode 131 and the silicon 119. More specifically, the semiconductor device 110 comprises the first insulating film 109 that covers the outer side face of the pipe-shaped through electrode 115, and the second insulating film 133 that covers the inner side face of the pipe-shaped through electrode 115 and the side face of the stripe-shaped through electrodes 117. Having such configuration, the insulation between the pipe-shaped through electrode 115 and the semiconductor region (silicon 119) remained in the side thereof can be ensured. In addition, the insulation between the stripe-shaped through electrodes 117 and the semiconductor region (silicon 119) remained in the side thereof can be ensured.

The through electrode 131 is composed of a conductive material. The material of the through electrode 131 may be, for example, the same material as employed for the pipe-shaped through electrode 103 described in the first embodiment and the stripe-shaped through electrodes 107 in the first embodiment. A conductive member such as a bump or an interconnect may be coupled to the upper face or the lower face of the pipe-shaped through electrode 115, the stripe-shaped through electrodes 117 or the silicon 119 as described later, though it is not shown in FIG. 3 or FIG. 4.

The first insulating film 109 is a loop-shaped film provided in a periphery portion of the silicon substrate 101. In addition, the material of the second insulating film 133 may be, for example, the same material as employed for the first insulating film 109. Thickness of the second insulating film 133 may be, for example, equal to or higher than 10 nm. Having such configuration, functions as the barrier film can further be ensured.

While the configuration of providing one through hole and one structure 130 on the silicon substrate 101 is illustrated in FIG. 3, number and arrangement of the structure (s) 130 are not particularly limited, and may be suitably selected depending on the design of the semiconductor device 110. In addition, while the cross section of through electrode shown in FIG. 4 is rectangle, the cross section of through electrode may be shape that is not rectangle (for example, taper, reverse-taper and the like).

The semiconductor device 110 shown in FIG. 3 may be manufactured similarly as in the manufacturing of the semiconductor device 100 described in the first embodiment (FIG. 1). In such occasion, in the manufacturing process described above in reference to FIG. 7A, openings are formed on the silicon substrate 101 so that plurality of silicons 119 that are mutually parallel are remained in the openings.

In the semiconductor device 110 shown in FIG. 3, the structure 130 comprises the through electrodes 131. Since the pipe-shaped through electrode 115 and the stripe-shaped through electrodes 117, which compose the through electrode 131, are formed to provide a continuous and integral member, the through electrodes arranged with highest density can be formed while maintaining the level of the filling characteristics for the slit via. In addition, further reduction in the capacity and reduction in the required area of the region for forming the through electrodes can be achieved, as compared with a configuration, in which a plurality of stripe-shaped through electrodes, which are formed away from each other, are arranged in a through hole.

The structure 130 shown in FIG. 3 can provide an electrical coupling from the through electrode 131 formed as a continuous and integral member to a single interconnect. Having this configuration, the coupling reliability and the coupling stability can be improved. In addition, since the through electrode 131 is a continuous and integral member, the parasitic capacitance can be further reduced while providing an increased interconnect density.

Figure 5:
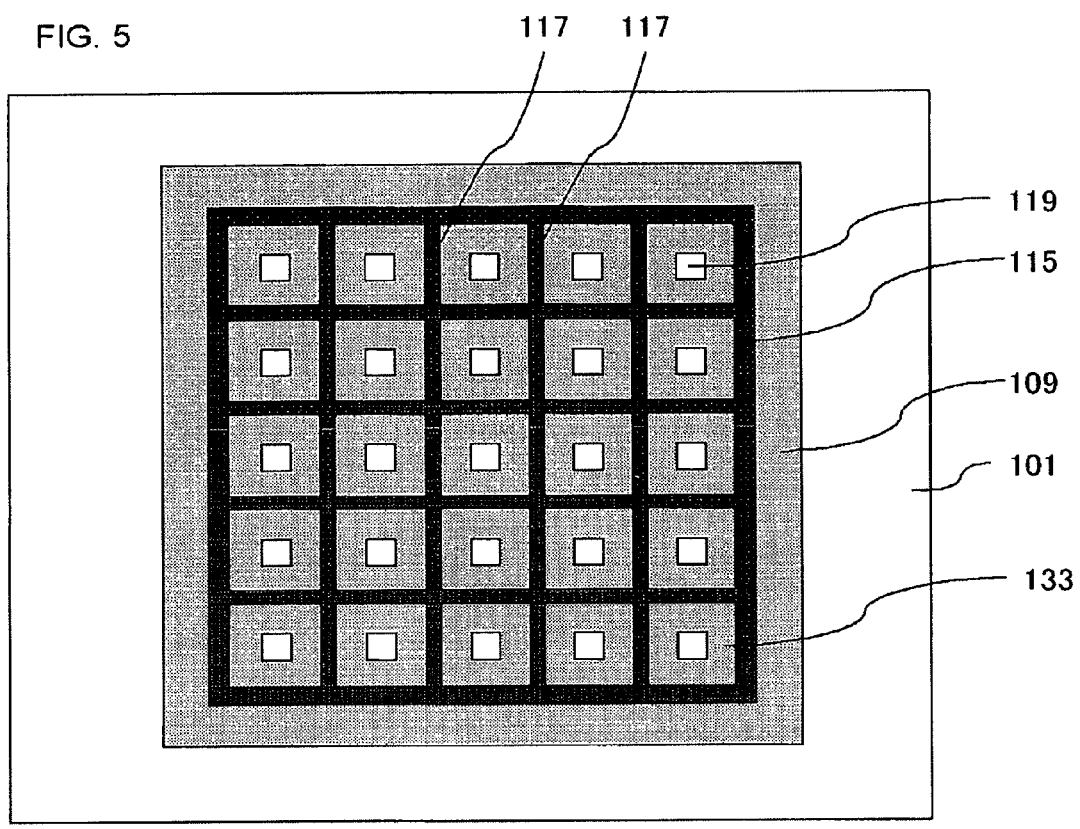
FIG. 5 is a plan view, schematically showing a configuration of a semiconductor device according to the embodiment of the present invention.

While the configuration of providing a plurality of stripe-shaped through electrodes 117 arranged in parallel is illustrated in FIG. 3, another stripe-shaped through electrodes 117 that are orthogonal to the mutually parallel multiple stripe-shaped through electrodes 117 may further be provided. FIG. 5 is a plan view showing a configuration of semiconductor device having through electrode 131 that stripe-shaped through electrodes 117 are disposed with lattice-shaped schematically. A ratio of an area of a region for forming the stripe-shaped through electrodes 117 (that is, an area of region enclosed by the pipe-shaped through electrode 115) to a length of the stripe-shaped through electrodes 115 and the stripe-shaped through electrodes 117 in the two-dimensional configuration can be further reduced by employing the configuration shown in FIG. 5.

In addition, the two-dimensional shape of the pipe-shaped through electrode 115 is not limited to rectangular shape provided that it is pipe-shaped in the present embodiment. For example, the two-dimensional shape of the pipe-shaped through electrode 115 may be a circular loop, an elliptic loop, polygonal loop or the like.

Figure 6:
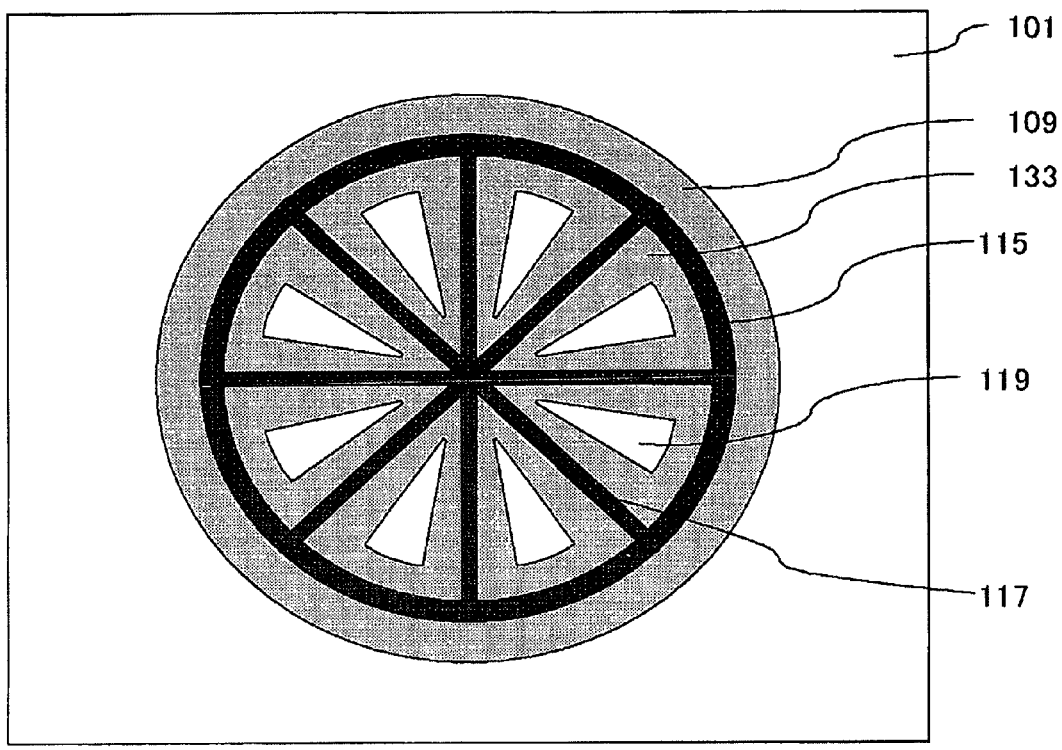
FIG. 6 is a plan view, schematically showing a configuration of a semiconductor device according to the embodiment of the present invention.

FIG. 6 is a plan view, schematically showing a configuration of the through electrode that has a pipe-shaped through electrode 115 having a two-dimensional shape of circular loop. The semiconductor device shown in FIG. 6 comprises a plurality of stripe-shaped through electrodes 117, which are capable of coupling the different two regions of the pipe-shaped through electrode 115 and respectively intersect at the central axis of the pipe-shaped through electrode 115. According to this configuration, since better symmetric property in the shape of the through electrode 131 is provided, it is the configuration that can be manufactured more stably.

Third Embodiment

The semiconductor devices described in the above embodiments can preferably be employed in the multi-chip modules. The multi-chip module may have a configuration, in which, for example, the semiconductor devices according to the above embodiments and other type of semiconductor devices are stacked, and the through electrode extending through (penetrating) the silicon substrate 101 and the conductive member of other semiconductor device are electrically coupled.

FIG. 9 is a cross-sectional view, schematically showing a configuration of a multi-chip module having a configuration that plurality of (three for the case of FIG. 9) layers of the semiconductor device 110 described in the second embodiment (FIG. 3) are stacked. In FIG. 9, the through electrodes 131 provided in each of the semiconductor devices 110 are linearly arranged toward a direction that is perpendicular to the face of the silicon substrate 101. Adjacent through electrodes 131 are coupled with each other through a bump 135. Having such configuration, electrical coupling between the semiconductor devices 110 stacked with smaller area can be fully ensured. Here, the semiconductor device 110 may be a semiconductor device having a function to store information, for example.

Figure 10:
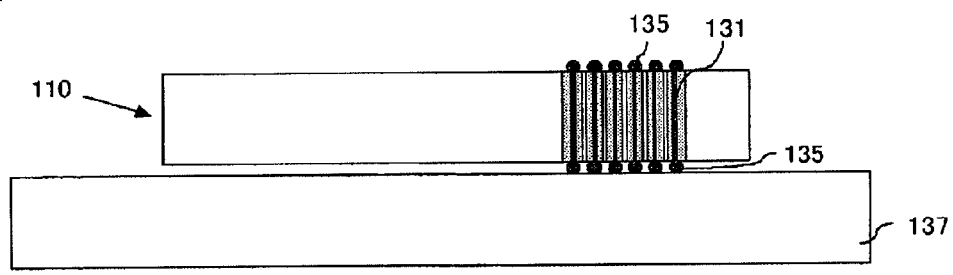
FIG. 10 is a cross-sectional view, schematically showing a configuration of a semiconductor device according to the embodiment of the present invention.

FIG. 10 is a cross-sectional view, schematically showing a configuration of a semiconductor device provided with the semiconductor device 110 described in the second embodiment on a printed circuit board. In the semiconductor device 110 in FIG. 10, an interconnect provided on a printed circuit board 137 is coupled to a through electrode 131 through the bump 135. Having such configuration, electrical coupling between the semiconductor device 110 and the printed circuit board 137 can be fully ensured with a smaller area.

Here, the semiconductor device 100 described in the first embodiment (FIG. 1) may be employed in the cases of FIG. 9 and FIG. 10. In addition, when the semiconductor device 100 is applied to the configuration of FIG. 9 and each of the through electrodes in the structure 120 is coupled through a conductive member such as a bump, a configuration of providing smaller number of the stripe-shaped through electrodes 107 in the upper layer of the semiconductor device 100 may be presented. This can reduce the number of the stripe-shaped through electrodes 107 to a minimum.

In addition, while a semiconductor substrate comprising silicon is shown in above embodiments, a semiconductor substrate comprising other material (for example, GaAs and the like) may be used.

While the embodiments of the present invention have been described above in reference to the annexed figures, it should be understood that the descriptions above are presented for the purpose of illustrating the present invention, and various configurations other than the above-described configurations can also be adopted.

It is apparent that the present invention is not limited to the above embodiment, that may be modified and changed without departing from the scope and spirit of the invention.

What is claimed is:

1. A semiconductor module, comprising a multilayered structure that includes a plurality of semiconductor devices,
    wherein each of said semiconductor devices comprises:
    a semiconductor substrate;
    a first electric conductor extending through said semiconductor substrate, wherein the first electric conductor is a loop, the loop enclosing a first region of the semiconductor substrate; and
    a plurality of second electric conductors extending through said semiconductor substrate and being provided in the interior of said first electric conductor spaced away from said first electric conductor, wherein the plurality of the second electric conductors are provided in the interior of the first region enclosed by said loop and are spaced away from said first electric conductor,
    wherein said first electric conductor or said second electric conductor of one of said semiconductor devices is electrically coupled to another one of said semiconductor devices.

2. A semiconductor module, comprising a multilayered structure that includes a plurality of semiconductor devices, wherein each of said semiconductor devices comprises:
a semiconductor substrate;
a first electric conductor extending through said semiconductor substrate, wherein the first electric conductor is a loop; and
a second electric conductor, extending through said semiconductor substrate and coupled to opposite sides of said loop, the second electric conductor dividing a region enclosed by said first electric conductor into more than one sub region,
wherein said first electric conductor or said second electric conductor of one of said semiconductor devices is electrically coupled to another one of said semiconductor devices.

* * * * *